(12) United States Patent
Lee et al.

(10) Patent No.: US 12,082,366 B2
(45) Date of Patent: *Sep. 3, 2024

(54) CABLE MANAGEMENT ASSEMBLY FOR FIREARM

(71) Applicants: Shanyao Lee, Santa Ana, CA (US); Hung-Ju Lee, Santa Ana, CA (US)

(72) Inventors: Shanyao Lee, Santa Ana, CA (US); Hung-Ju Lee, Santa Ana, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/353,619

(22) Filed: Jun. 21, 2021

(65) Prior Publication Data

US 2022/0408586 A1 Dec. 22, 2022

(51) Int. Cl.
*F41C 27/00* (2006.01)
*H05K 7/18* (2006.01)

(52) U.S. Cl.
CPC ............. *H05K 7/183* (2013.01); *F41C 27/00* (2013.01)

(58) Field of Classification Search
CPC .......... F41C 27/00; F41C 23/16; F41C 23/22; F41G 11/00
See application file for complete search history.

(56) References Cited

U.S. PATENT DOCUMENTS

| | | | | |
|---|---|---|---|---|
| 6,568,118 B1 * | 5/2003 | Teetzel | ...................... | F41G 1/48 42/105 |
| 6,782,652 B1 * | 8/2004 | Erickson | ................. | F41A 35/02 42/143 |
| 7,199,315 B1 * | 4/2007 | Sharrah | ...................... | F41G 1/34 200/61.43 |
| 7,243,454 B1 * | 7/2007 | Cahill | ...................... | F41C 23/16 42/72 |
| 7,627,975 B1 * | 12/2009 | Hines | .................... | F41G 11/003 42/84 |
| 7,845,105 B1 * | 12/2010 | Cahill | ...................... | F41C 27/00 42/117 |
| 8,091,265 B1 * | 1/2012 | Teetzel | ..................... | F41C 23/16 42/71.01 |
| 8,146,282 B2 * | 4/2012 | Cabahug | ................ | F41C 23/22 42/72 |
| 8,225,544 B2 * | 7/2012 | Darian | ..................... | F41C 23/22 42/84 |
| 8,322,064 B2 * | 12/2012 | Cabahug | ................ | F41C 27/00 42/71.01 |
| 8,429,845 B1 * | 4/2013 | Swan | ..................... | F41G 11/002 42/71.01 |
| 8,443,539 B2 * | 5/2013 | Cabahug | ............... | F41G 11/003 42/71.01 |
| 8,850,735 B2 * | 10/2014 | Kenney | ..................... | F41A 3/66 42/106 |
| 8,875,434 B2 * | 11/2014 | Michal | .................... | F41C 27/00 42/96 |
| 9,200,867 B1 * | 12/2015 | Swan | ..................... | F41C 23/16 |
| 9,488,436 B2 * | 11/2016 | Abst | ..................... | F41G 11/003 |
| 9,823,043 B2 * | 11/2017 | Compton | ............... | F41C 27/00 |

(Continued)

*Primary Examiner* — Michelle Clement
(74) *Attorney, Agent, or Firm* — Ying-Ting Chen; Law Office of Michael Chen (57) ABSTRACT

A cable management assembly for attachment to a rail of a firearm may include a main body having a bottom surface; a plurality of grooves formed on the bottom surface; a cable selectively embedded within the plurality of the grooves; wherein one of the plurality of grooves is communicated with the other one of the plurality of grooves.

14 Claims, 11 Drawing Sheets

(56) References Cited

U.S. PATENT DOCUMENTS

| | | | | |
|---|---|---|---|---|
| 9,829,274 B2* | 11/2017 | Vallo | | F41C 23/18 |
| 9,891,023 B2* | 2/2018 | Compton | | H02J 7/025 |
| 9,897,411 B2* | 2/2018 | Compton | | F41G 11/00 |
| 9,921,028 B2* | 3/2018 | Compton | | H04B 5/0037 |
| 10,082,363 B2* | 9/2018 | Burgess | | F41G 11/003 |
| 10,337,834 B2* | 7/2019 | Downing | | F41G 9/00 |
| 10,337,836 B2* | 7/2019 | Righi | | F41G 11/003 |
| 10,386,148 B1* | 8/2019 | Handrick | | F41A 21/44 |
| 10,458,754 B2* | 10/2019 | Miller | | F41G 11/003 |
| 10,514,235 B1* | 12/2019 | McCauley | | H01H 9/02 |
| 10,663,261 B2* | 5/2020 | Summerfield | | F41G 11/003 |
| 10,876,814 B1* | 12/2020 | Visser | | F41C 23/22 |
| 11,175,114 B1* | 11/2021 | Lee | | F16L 3/02 |
| 2007/0235298 A1* | 10/2007 | Kim | | F41G 1/34 |
| | | | | 200/18 |
| 2009/0241397 A1* | 10/2009 | Fitzpatrick | | F41C 23/16 |
| | | | | 42/90 |
| 2010/0083553 A1* | 4/2010 | Montgomery | | F41C 27/00 |
| | | | | 42/84 |
| 2010/0192446 A1* | 8/2010 | Darian | | F41G 11/003 |
| | | | | 320/108 |
| 2010/0192448 A1* | 8/2010 | Darian | | F41G 11/003 |
| | | | | 42/84 |
| 2010/0287809 A1* | 11/2010 | Williams | | F41G 11/003 |
| | | | | 42/90 |
| 2011/0000120 A1* | 1/2011 | Thompson | | F41C 27/00 |
| | | | | 42/84 |
| 2011/0131858 A1* | 6/2011 | Darian | | F41G 11/003 |
| | | | | 42/90 |
| 2011/0214328 A1* | 9/2011 | Williams | | F41G 11/003 |
| | | | | 42/90 |
| 2012/0085013 A1* | 4/2012 | Cahill | | F41C 27/00 |
| | | | | 42/96 |
| 2012/0266514 A1* | 10/2012 | Michal | | F41C 23/18 |
| | | | | 42/90 |
| 2014/0000142 A1* | 1/2014 | Patel | | F41A 11/02 |
| | | | | 42/14 |
| 2014/0076146 A1* | 3/2014 | Gomez | | F41A 21/48 |
| | | | | 89/191.01 |
| 2014/0115936 A1* | 5/2014 | Kenney | | F41G 11/003 |
| | | | | 42/16 |
| 2014/0223794 A1* | 8/2014 | Brown | | F41C 23/16 |
| | | | | 42/75.03 |
| 2014/0263497 A1* | 9/2014 | Visalli | | F41C 33/0263 |
| | | | | 42/70.11 |
| 2014/0360077 A1* | 12/2014 | Miller | | F41G 1/387 |
| | | | | 42/84 |
| 2015/0253090 A1* | 9/2015 | Kirchhoff | | F41G 11/001 |
| | | | | 42/71.01 |
| 2015/0345896 A1* | 12/2015 | Michal | | F41C 23/16 |
| | | | | 42/75.01 |
| 2016/0169610 A1* | 6/2016 | Hines | | F41A 35/02 |
| | | | | 42/90 |
| 2016/0211095 A1* | 7/2016 | Zimmer | | H01H 9/0235 |
| 2016/0265871 A1* | 9/2016 | Vallo | | F41C 23/16 |
| 2016/0356567 A1* | 12/2016 | Bybee | | F41C 23/16 |
| 2017/0082399 A1* | 3/2017 | Moore | | F41G 1/35 |
| 2018/0010881 A1* | 1/2018 | Garst | | F41A 11/02 |
| 2018/0164071 A1* | 6/2018 | Burgess | | F41G 11/003 |
| 2018/0364008 A1* | 12/2018 | Summerfield | | F41G 1/44 |
| 2021/0018297 A1* | 1/2021 | Swallow | | A45F 5/02 |
| 2021/0270573 A1* | 9/2021 | Verjovsky | | F41C 23/22 |
| 2021/0391892 A1* | 12/2021 | Ellena | | H04L 12/10 |

* cited by examiner

CABLE MANAGEMENT ASSEMBLY FOR FIREARM

FIELD OF THE DISCLOSURE

The present disclosure relates to a cable management assembly, and more particularly to a cable management assembly for a firearm which may not only enable to secure the cable on a rail the firearm, but also to guide a cable towards desired directions.

BACKGROUND OF THE DISCLOSURE

Many military, police and civilian firearms are equipped with rail configurations for mounting various accessories such as: optics, lights, vertical grips, lasers, and other items.

The traditional approach to mounting an accessory to a weapon is to use a rail which is mounted along the length of the barrel of the weapon. The rail typically comprises a series of ridges with a T-shaped cross-section interspersed with flat locking slots.

One non-limiting example of the problems associated with mounting accessories is the cable management. Usually, the traditional cable management is to utilize tapes, glue, or zips to tie the cables/wires on the handguard. However, this traditional method could not tightly secure the cables/wires, and the cables/wires easily fall down from the firearm during the shooting operation.

Accordingly, the mounting accessories with cables/wires present the challenge of cable/wire management in trying to keep the wire or wires closely proximate to the rail. This is particularly important for combat and tactical users to avoid snagging of wires or other interference with the firearm, although many of the current solutions still leave wires exposed and not closely secured to the rails.

To overcome this known problem, past solutions have involved developing a cover clip simply installed on the slot of the rail mounted on the firearm in order to organize, control, and route electrical cables and wires. Even if the improved cover clip could secure the electrical cables and wires on the rail of the firearm, it could not sufficiently organize the electrical cables and wires while a plurality of electrical devices are utilized.

In another non-limiting example of the problems associated with the improved cover clip is that the above improved cover clip generally provide to guide the electrical cables and wires along one single direction; therefore, if more than one electrical devices are utilized, it is a hassle to control or store all of the wires/cables along the right direction.

There may exist a desire to develop a cable management assembly which is compact in size, easy to install on the firearm, and also allow the cables and wires being tightly secured on the firearm along desired directions.

All referenced patents, applications and literatures are incorporated herein by reference in their entirety. Furthermore, where a definition or use of a term in a reference, which is incorporated by reference herein, is inconsistent or contrary to the definition of that term provided herein, the definition of that term provided herein applies and the definition of that term in the reference does not apply. The disclosed embodiments may seek to satisfy one or more of the above-mentioned desires. Although the present embodiments may obviate one or more of the above-mentioned desires, it should be understood that some aspects of the embodiments might not necessarily obviate them.

BRIEF SUMMARY OF THE DISCLOSURE

In a general implementation, a cable management assembly for attachment to a rail of a firearm comprises a main body having a bottom surface and opposing first and second side edges; a first sidewall extending from the first side edge and a second side wall extending from the second side edge to define a socket for slidably engaging with the rail; a plurality of grooves formed on the bottom surface; a cable selectively embedded within the plurality of the grooves; wherein the plurality grooves comprises opposing first and second grooves and a third groove communicated with the first and second grooves.

In another aspect combinable with the general implementation, the first sidewall is outwardly extended from the first side edge to form the first groove and downwardly extended to exceed the bottom surface.

In another aspect combinable with the general implementation, the second sidewall is outwardly extended from the second side edge to form the second groove and downwardly extended to exceed the bottom surface.

In another aspect combinable with the general implementation, the first groove is parallelly alignment with the second groove.

In another aspect combinable with the general implementation, the third groove is normal to the first groove and the second groove.

In another aspect combinable with the general implementation, the third groove is formed on the bottom surface and is extended to the first sidewall and the second sidewall to form opposing right and left side openings.

In another aspect combinable with the general implementation, the main body further comprises a pair of retaining lip, each of the retaining lips is arranged on opposing front and rear edges of the third groove.

In another aspect combinable with the general implementation, the retaining lips are integrally extended from the bottom surface and configured to secure the cable inside the third groove.

In another aspect combinable with the general implementation, the cable management assembly further comprises a rail securing protrusion on the bottom surface of the main body, wherein the rail securing protrusion is inserted into a slot formed on the rail of the firearm for securing the main body on the rail.

In another aspect combinable with the general implementation, the retaining lips are inserted into a slot formed on the rail of the firearm for securing the cable being fasten between the slot and the third groove.

In another aspect combinable with the general implementation, the cable is embedded inside the first groove and the second groove.

In another aspect combinable with the general implementation, the cable is embedded inside the first groove and then is bent to be embedded inside the second groove.

In another aspect combinable with the general implementation, the cable is embedded inside the first groove, the second groove, and the third groove.

In another aspect combinable with the general implementation, the cable is embedded inside the first groove, and then is bent to be embedded inside the third grove, and then is bent to be embedded inside the second groove.

In another aspect combinable with the general implementation, the cable is embedded inside the second groove without being embedded inside the first groove.

In another aspect combinable with the general implementation, the cable is embedded inside the second groove, and then is bent to be embedded inside the third groove, and then is passed through a right side opening of the third groove.

In another aspect combinable with the general implementation, the cable is embedded inside the third grove, and is passed through opposing right and left side opening of the third groove.

In another aspect combinable with the general implementation, the cable is embedded inside a partial first groove, and then is bent to be embedded inside the third groove, and then is bent to be embedded inside a partial second groove.

In another aspect combinable with the general implementation, the cable is embedded inside a partial second groove and is passed through a right side opening of the third groove.

In another aspect combinable with the general implementation, the third groove has one end communicated with the first groove, and the other end opposite of the one end communicated with the second groove.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above and below as acting in certain combinations and even initially claimed as such, one or more features from a claimed combination can in some cases be excised from the combination, and the claimed combination may be directed to a subcombination or variation of a subcombination.

A number of implementations have been described. Nevertheless, it will be understood that various modifications may be made without departing from the spirit and scope of the disclosure. For example, example operations, methods, or processes described herein may include more steps or fewer steps than those described. Further, the steps in such example operations, methods, or processes may be performed in different successions than that described or illustrated in the figures. Accordingly, other implementations are within the scope of the following claims.

The details of one or more implementations of the subject matter described in this disclosure are set forth in the accompanying drawings and the description below. Other features, aspects, and advantages of the subject matter will become apparent from the description, the drawings, and the claims.

BRIEF DESCRIPTION OF THE DRAWINGS

It should be noted that the drawing figures may be in simplified form and might not be to precise scale. In reference to the disclosure herein, for purposes of convenience and clarity only, directional terms such as top, bottom, left, right, up, down, over, above, below, beneath, rear, front, distal, and proximal are used with respect to the accompanying drawings. Such directional terms should not be construed to limit the scope of the embodiment in any manner.

DETAILED DESCRIPTION OF THE EMBODIMENTS

The different aspects of the various embodiments can now be better understood by turning to the following detailed description of the embodiments, which are presented as illustrated examples of the embodiments defined in the claims. It is expressly understood that the embodiments as defined by the claims may be broader than the illustrated embodiments described below.

Unless defined otherwise, all technical and position terms used herein have the same meaning as commonly understood by one of ordinary skill in the art to which the invention pertains. Although many methods and materials similar, modified, or equivalent to those described herein can be used in the practice of the present invention without undue experimentation, the preferred materials and methods are described herein. In describing and claiming the present invention, the following terminology will be used in accordance with the definitions set out below.

As used herein, a "partial" first groove, a "partial" second groove, and a "partial" third groove refer to only a part of the first groove, a part of the second groove, and a part of the third groove. The "part" refer to not the whole body of the groove.

The term "a" or "an" entity refers to one or more of that entity. As such, the terms "a" (or "an"), "one or more" and "at least one" can be used interchangeably herein. It is also to be noted that the terms "comprising," "including," and "having" can be used interchangeably.

It shall be understood that the term "means," as used herein, shall be given its broadest possible interpretation in accordance with 35 U.S.C., Section 112(f). Accordingly, a claim incorporating the term "means" shall cover all structures, materials, or acts set forth herein, and all of the equivalents thereof. Further, the structures, materials or acts and the equivalents thereof shall include all those described in the summary of the invention, brief description of the drawings, detailed description, abstract, and claims themselves.

Figure 1:
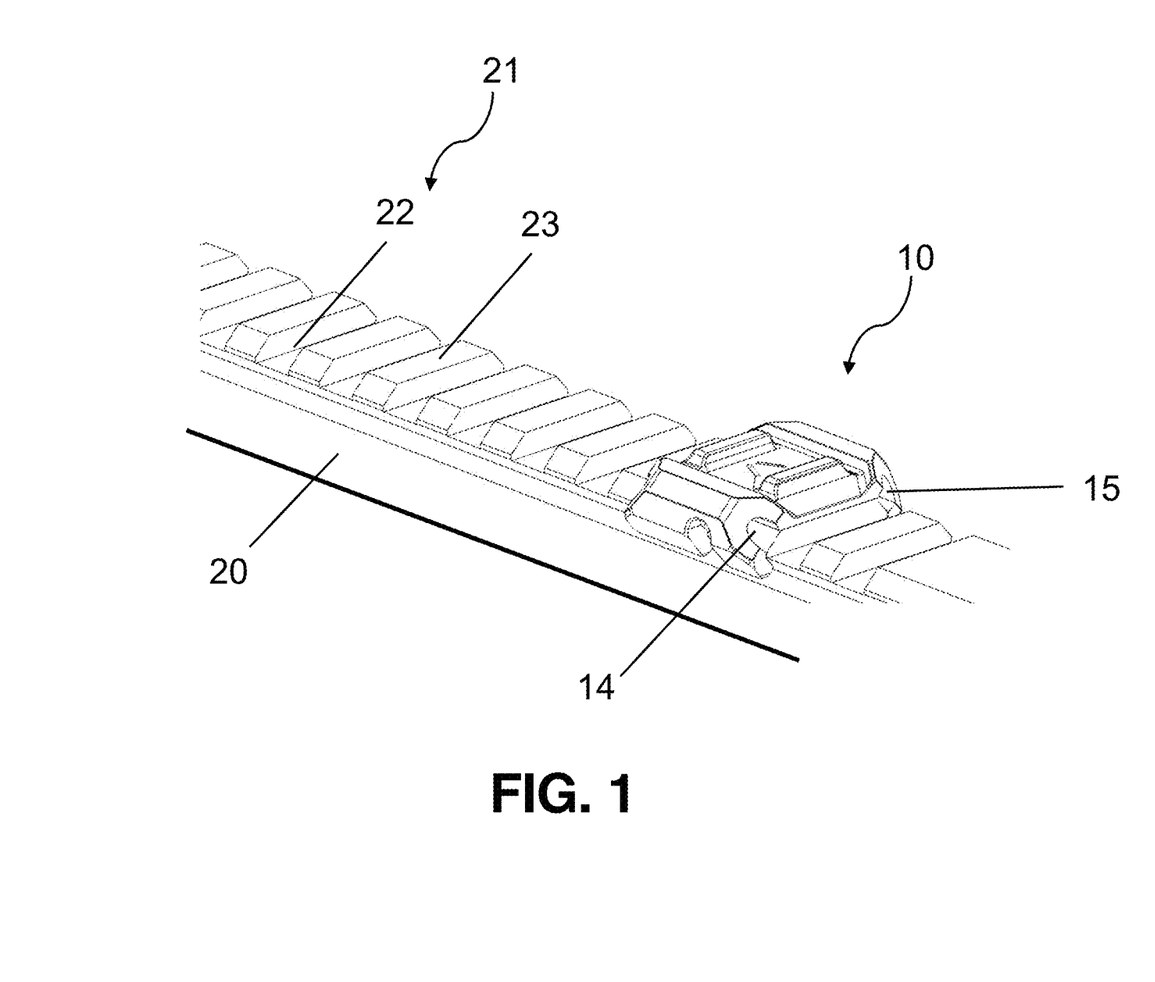
FIG. 1 is a perspective view of a cable management assembly being secured on a rail of a firearm according to an embodiment of the present invention.

FIG. 1 generally depicts a cable management assembly 10 for attachment to a rail 21 of a firearm 20 according to an embodiment of the present invention.

Referring to FIG. 1, the rail 21 comprises a plurality of transverse slots 22 and at least one of the plurality of transverse slots 22 may be covered by the cable management assembly 10, wherein the cable management assembly 10 may be secured on the rail 21 in order to manage a cable while the accessories are mounted on the firearm 20.

Here, the rail 21 of the firearm 20 further comprises a plurality of ribs 23 formed in parallel relationship, wherein the ribs 23 may be made to nest to form the plurality of transverse slots 22. It is noted that the ribs 23 may be to provide a low profile, positive gripping surface.

Figure 2:
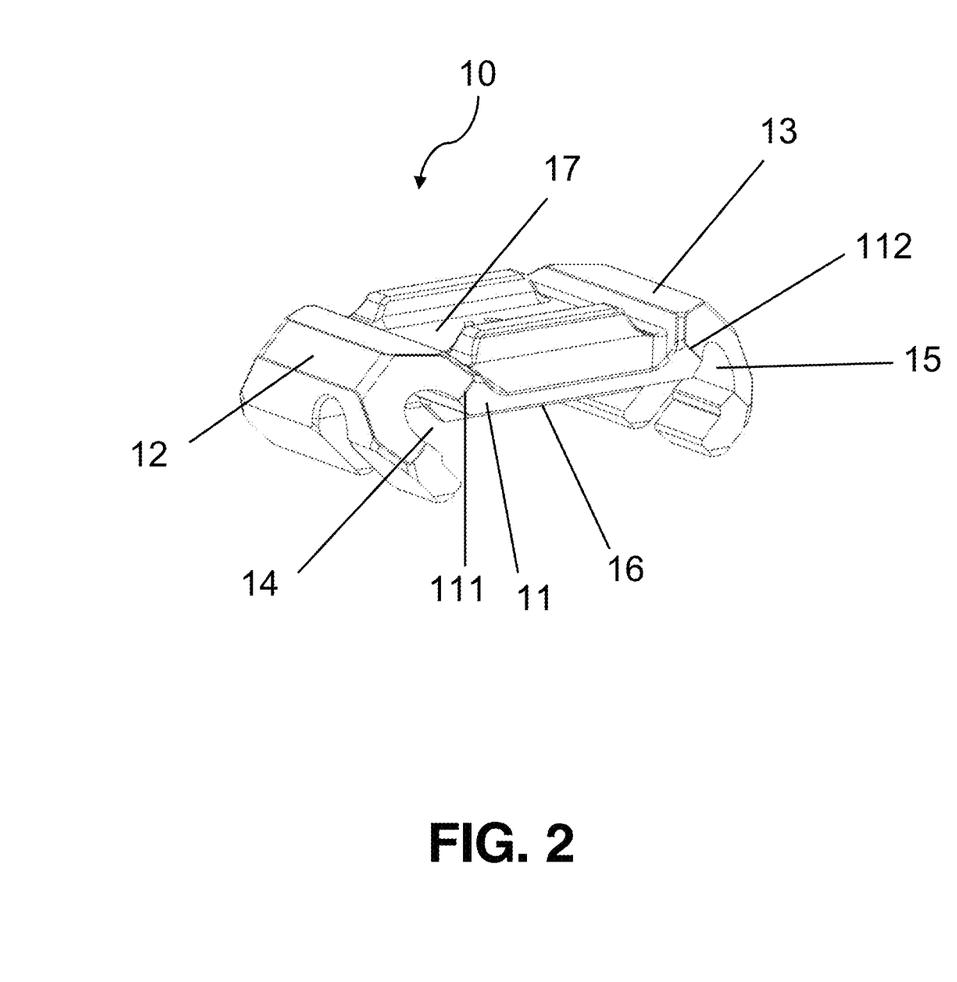
FIG. 2 is a perspective view of the cable management assembly according to the embodiment of the present invention.

FIG. 2 generally depicts the cable management assembly 10 according to the embodiment of the present invention.

Referring to FIG. 2, the cable management assembly 10 comprises a main body 11 having a first side edge 111 and a second side edge 112 opposite of the first side edge 111, a first sidewall 12 extending from the first side edge 111, a second sidewall 13 extending from the second side edge 112, and a plurality of grooves comprising a first groove 14 and a second groove 15, wherein the first sidewall 12 and the second sidewall 13 define a socket for slidably engaging with the rail of the firearm.

In an embodiment, a size of the socket may be slightly larger than a width of the rail, and in such manner, the cable management assembly 10 may be slidable along the rail and selectively be secured thereon.

In an embodiment, the first sidewall 12 may be outwardly extended from the first side edge 111 to form the first groove 14 and downwardly extended to exceed a bottom edge 16 of the main body 11.

In an embodiment, the second sidewall 13 may be outwardly extended from the second side edge 112 to form the second groove 15 and downwardly extended to exceed the bottom edge 16 of the main body 11. It is noted that the first sidewall 12 may be opposite of the second sidewall 13.

In an embodiment, the main body 11 further comprises a top edge 17 opposite of the bottom edge 16, and the main body 10 has a thickness defined between the top edge 17 and the bottom edge 16, wherein the thickness of the main body 10 may be larger than a thickness of the first sidewall 12 and a thickness of the second sidewall 13. Here, the thickness of the first sidewall 12 may be defined between an inner surface of the first sidewall 12 and an outer surface of the first sidewall 12, and the thickness of the second sidewall 13 may be defined between an inner surface of the second sidewall 13 and an outer surface of the second sidewall 13.

As shown in FIG. 1 and FIG. 2, while the cable management assembly 10 is mounted on the rail 21 of the firearm 20, the first groove 14 and the second groove 15 may be located outside the ribs 23 of the rail 21, and the cable may be inserted into the first groove 14 and/or the second groove 15 in order to secure the cable between the cable management assembly 10 and the rail 21 of the firearm 20.

Figure 3:
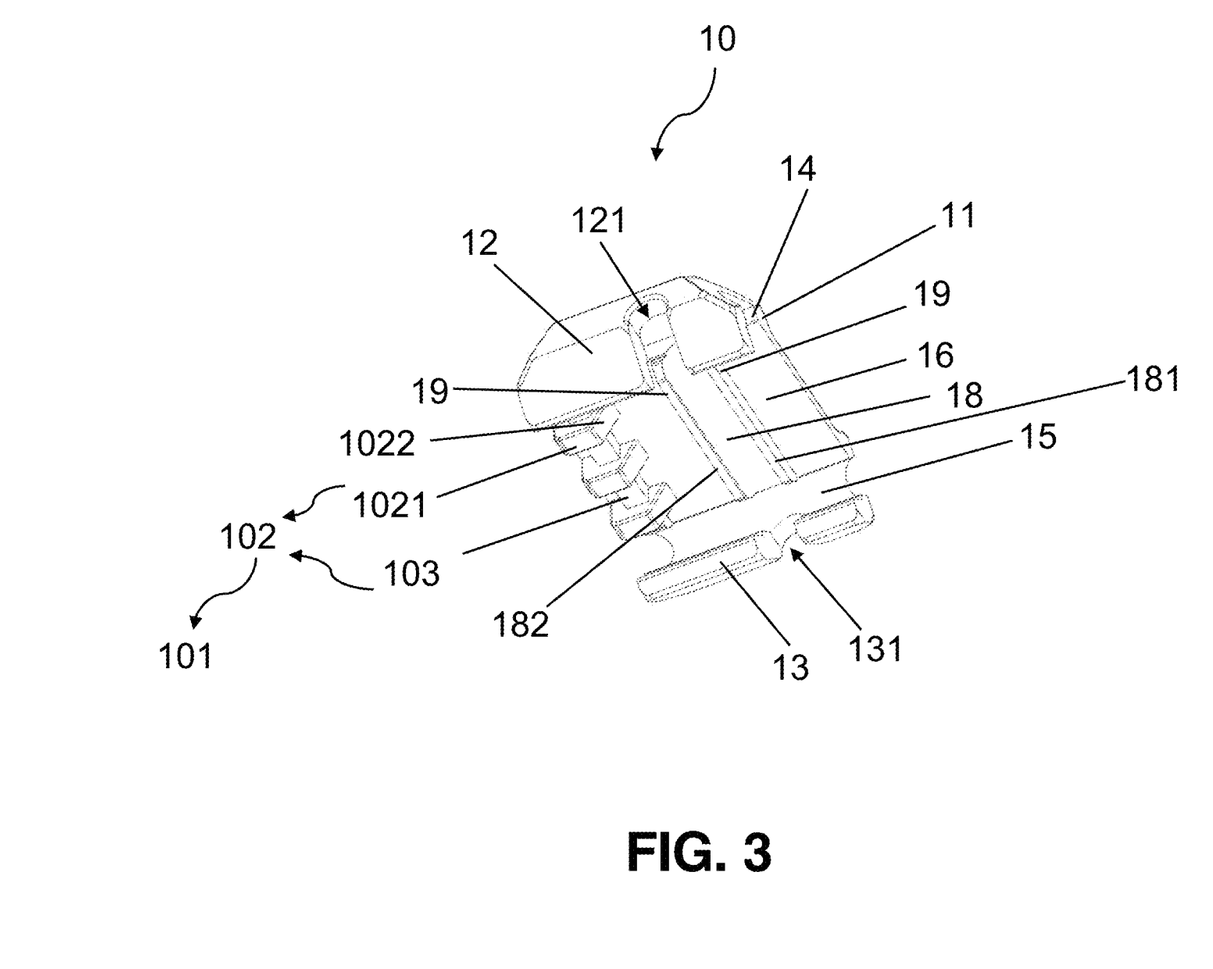
FIG. 3 is a bottom view of the cable management assembly according to the embodiment of the present invention.

FIG. 3 generally depicts a bottom view of the cable management assembly 10 according to the embodiment of the present invention.

Referring to FIG. 3, the main body 11 comprises the bottom surface 16, wherein the plurality of grooves further comprises a third groove 18 formed on the bottom surface 16. In an embodiment, the first groove 14 may be parallel alignment with the second groove 15, and the third groove 18 may be communicated with the first groove 14 and the second groove 15. Here, the third groove 18 has one end communicated with the first groove 14, and the other end communicated with the second groove 15, wherein the one end of the third groove 18 may be opposite of the other end of the third groove 18.

In an embodiment, one of the plurality of grooves (e.g., the first groove 14, the second groove 15, or the third groove 18) may be communicated with the other one of the plurality of grooves (e.g., the first groove 14, the second groove 15, or the third groove 18). It should be noted that the one of the plurality of grooves (e.g., the first groove 14, the second groove 15, or the third groove 18) may be communicated with the other one of the plurality of grooves (e.g., the first groove 14, the second groove 15, or the third groove 18) at a predetermined angle. The predetermined angle could be, but not limited to, 180 degrees, 175 degrees, or an angle equal to or below to 180 degrees.

In an embodiment, the third groove 18 may be normal to the first groove 14 and the second groove 15. Here, the third groove 18 may be extended to the first sidewall 12 to form a left side opening 121 and may be extended to the second sidewall 13 to form a right side opening 131, wherein the left side opening 121 may be parallel alignment with the right side opening 131.

According to the embodiment of FIG. 3, the main body 11 further comprises a pair of retaining lip 19. Here, the third groove 18 comprises a front edge 181 and a rear edge 182 opposite of the front edge, wherein one of the pair of the retaining lip 19 may be formed on the front edge of the third groove 18 and the other one of the pair of the retaining lip 19 may be formed on the rear edge of the third groove 18. Here, the pair of the retaining lip 19 may be integrally extended from the bottom surface 16 of the main body 11.

In an embodiment, the cable management assembly 10 further comprises a rail securing protrusion 101 integrally extended from the bottom surface 16 of the main body 11, wherein the rail securing protrusion 101 comprises a plurality of locking members 102, and each of the locking members 102 may be connected through a plurality of connection members 103.

Figure 4:
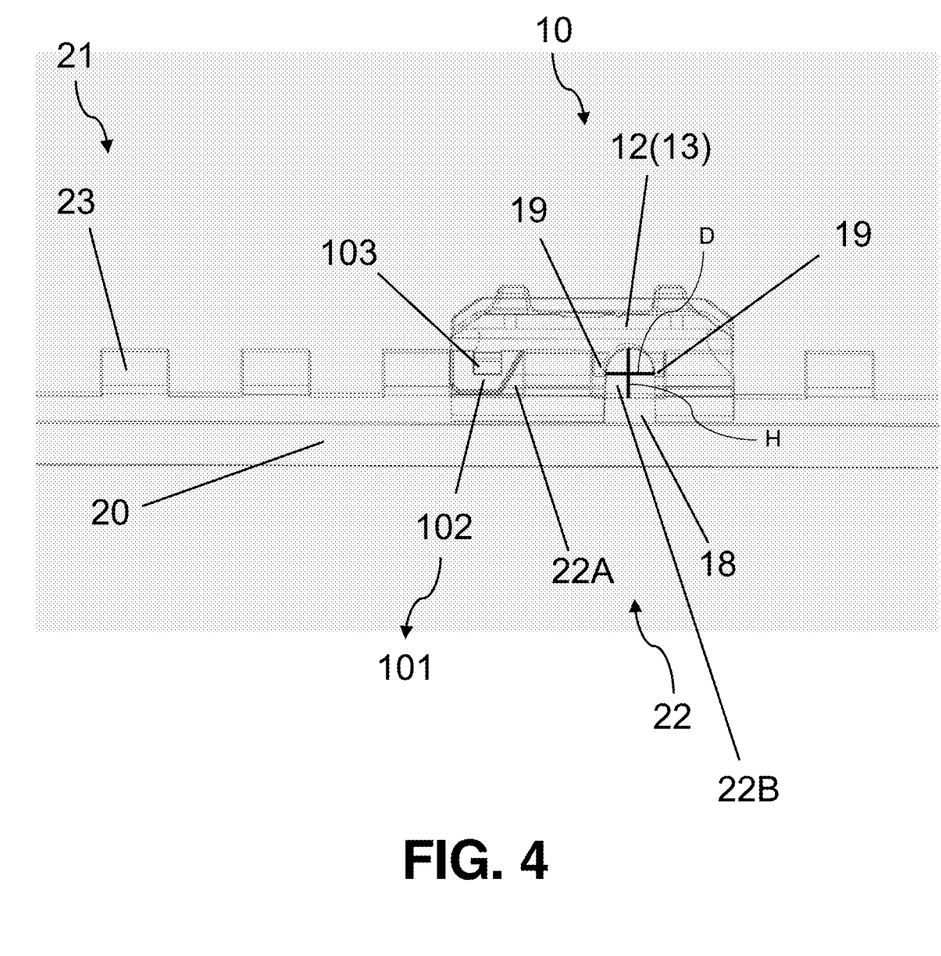
FIG. 4 is a side view of the cable management assembly being secured on the rail of the firearm according to the embodiment of the present invention.

FIG. 4 generally depicts a side view of the cable management assembly 10 mounting on the rail 21 of the firearm 20.

Referring to FIG. 4, the rail securing protrusion 101 may be inserted into a transverse slot 22A formed on the rail 21 of the firearm 20 and the pair of the retaining lip 19 may be inserted into another transverse slot 22B formed on the rail 21 of the firearm 20, and in such a way, the cable management assembly 10 may be securely locked on the rail 21 of the firearm 20.

In an embodiment, lengths of the pair of retaining lips 19 may be shorter than a depth of the transverse slot 22A and/or another transverse slot 22B formed on the rail 21, and the lengths of the retaining lips 19 may be shorter than a depth of the third groove 18. For example, while the first sidewall 12 and/or the second sidewall 13 are locked on the rail 21 with the rail securing protrusion 101 being inserted into the transverse slot 22A, the pair of the retaining lips 19 may be inserted into the another transverse slot 22B.

It is noted that the pair of the retaining lip 19 may be spacedly arranged on the front and rear edges of the third grooves 18 at a distance (D), and the distance (D) between the pair of the retaining lip 19 may be shorter than a height (H) of each of the plurality of transverse slots 22 (including the transverse slot 22A and the another transverse slot 22B) on the rail 21, as shown in FIG. 4, and in such a way, the pair of the training lips 19 may be inserted in any one of the transverse slots 22 (including the transverse slot 22A and said another transverse slot 22B) of the rail 21.

According to the embodiment of FIG. 4, the locking member 102 of the rail securing protrusion 101 has a length defined between the bottom surface 16 of the main body 11 and a bottom face 1021 of the locking member 102 (as shown in FIG. 3), wherein each of the length of the locking member 102 may be shorter or equal to the depths of each of the plurality of the transverse slot 22 (including the transverse slot 22A and the another transverse slot 22B). Here, the bottom face 1021 of the locking member 102 may be flat surface.

In an embodiment, the locking member 102 further comprises an angled front face 1022 integrally extended from the bottom face 1021 of the locking member 102 to the bottom surface 16 of the main body 11 (as shown details in FIG. 3). It is noted that the locking member 102 has a thickness defined between a front edge of the locking member 102 and a rear edge of the locking member 102, wherein the thickness of the locking member 102 may be shorter than the width of each of the transverse slots 22 (including the transverse slot 22A and the another transverse slot 22B). In such way, the locking member 102 of the rail securing protrusion 101 may be inserted into the transverse slot 22 (including the transverse slot 22A and the another transverse slot 22B) and the angled front face 1022 of the locking member 102 may be configured to facilitate the locking member 102 being releasing from the any one of the transverse slots 22 (including the transverse slot 22A and the another transverse slot 22B).

In another embodiment, the angled front face 1022 defines a slope with respect to the bottom face 1021 of the locking member 102 or the bottom surface 16 of the main body 11. Here, the rail 21 of the firearm 20 may allow a tolerance (as shown details in FIG. 3). For example, while the angled front face 1022 defines a 90 degrees angle with respect to the bottom face 1021 of the locking member 102 or the bottom surface 16 of the main body 11, the locking member 102 may be too big or too small for engaging with the any one of the transverse slots 22 (including the transverse slot 22A and the another transverse slot 22B). For another example, while the angled front face 1022 define a 90 degrees angle with respect to the bottom face 1021 of the locking member 102 or the bottom surface 16 of the main body 11, the locking member 102 may be completely fitted with the any one of the transverse slots 22 (including the transverse slot 22A and the another transverse slot 22B), and in such a way, it is hassle to either insert into or release the locking member 102 from the any one of the transverse slots 22 (including the transverse slot 22A and the another transverse slot 22B). It is noted that an angle defined by the angled front face 1022 with respect to the bottom face 1021 of the locking member 102 or an angle defined by the angled front face 1022 with respect to the bottom surface 16 of the main body 11 may be either larger than 90 degrees or smaller than 90 degrees in order to adjust the tolerance of the rail 21 of the firearm 20. As shown further in FIG. 4, while the cable management assembly 10 is mounted on the rail 21 of the firearm 20, the bottom surface 16 of the main body 11 may be biased against the ribs 23 of the rail 21 with the pair of the retaining lips 19 and the rail securing protrusion 101, including the locking member 102 and the connection member 103, being inserted into the transverse slots 22 (including the transverse slot 22A and the another transverse slot 22B) of the rail 21. In this manner, the cable management assembly 10 may be securely mounted on the rail 21 without falling down or bumping off therefrom.

At least two of the transverse slots 22 (including the transverse slot 22A and the another transverse slot 22B) of the rail 21 may be utilized to be engaged with the retaining lips 19 and the rail securing protrusion 101, wherein the transverse slot 22A may be utilized to have the rail securing protrusion 101 being engaged therewith, and the another transverse slots 22B may be utilized to have the third groove 18 and the pair of the retaining lips 19 being engaged therewith.

In an embodiment, the cable may be inserted into the another transverse slot 22B where the third groove 18 and the pair of the retaining lips 19 are inserted therein, and in such a way, the cable may be secured between the third groove 18 and the another transverse slot 22B in order to manage and guide the cable to the desired direction.

In another embodiment, the cable may be embedded inside the third groove 18 and the another transverse slot 22B formed on the rail 21, and in such a manner, the cable may be locked into the third groove 18 by the pair of the retaining lips 19. In other words, the cable may be secured within the third groove 18 without being loosing from the third groove 18.

Figure 5A:
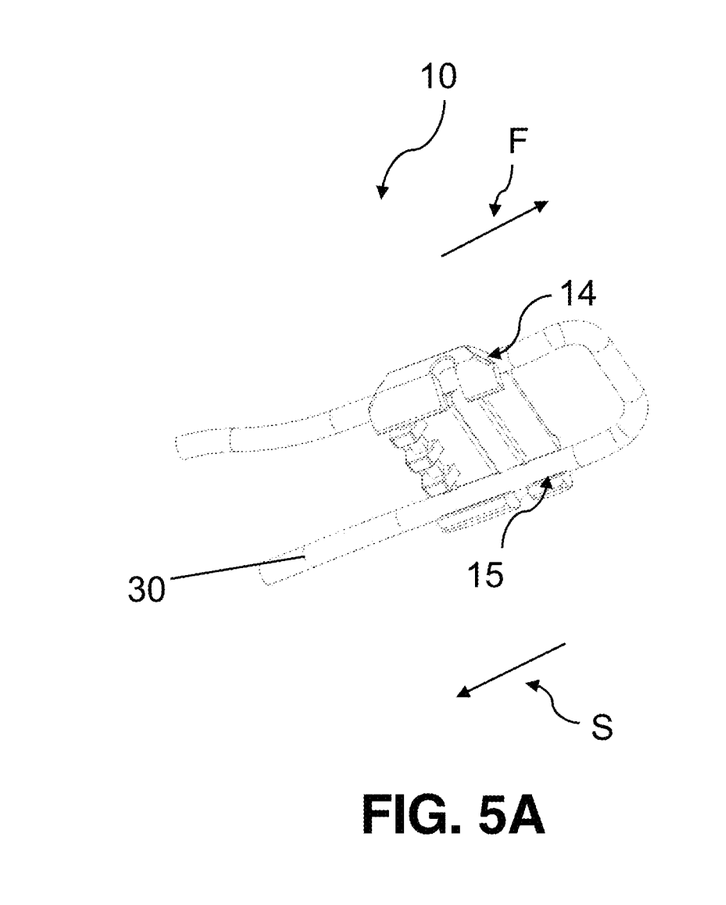
FIG. 5A is a bottom view of the cable management assembly being secured on the rail of the firearm according to an embodiment of the present invention.
Figure 5B:
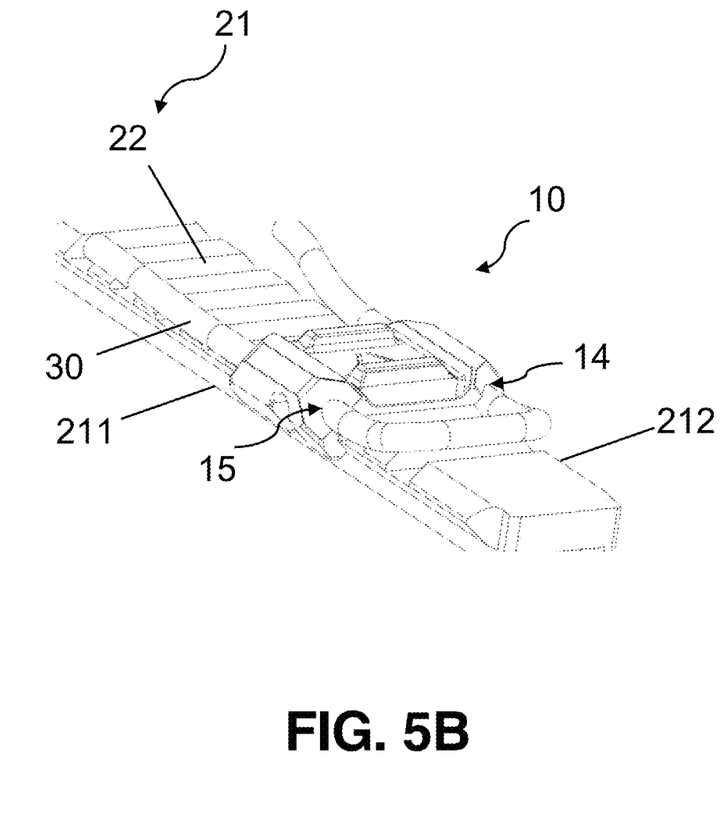
FIG. 5B is a perspective view of the cable management assembly being secured on the rail of the firearm according to the embodiment of the present invention.

FIGS. 5A-5B generally depict the cable management assembly 10 with the cable 30 embedded inside the plurality of grooves.

Referring to FIGS. 5A-5B, the cable 30 may be embedded inside the first groove 14, and then may be bent at a predetermined angle and further may be embedded inside the second groove 15. For example, the cable 30 may be secured on the rail 21 and be bent towards a first direction F and further may be bent towards a second direction S opposite of the first direction F. As shown in FIGS. 5A-5B, while the cable management assembly 10 is mounted on the rail 21, the cable 30 may be passed through the first groove 14 towards the first direction F and then may be bent to be passed through and embedded inside the second groove 15 towards the opposite direction (the second direction S). Here, the cable 30 may be secured inside the first groove 14 and the second groove 15. In other words, the cable 30 may be secured between the first and second groove 14, 15 and the rail 21.

In an embodiment, the diameter of the first groove 14 and the diameter of the second groove 15 may be bigger than a diameter of the cable 30.

In an embodiment, the cable 30 may be secured along a side edge 211 of the rail 21 and an opposite side edge 212 of the rail 21.

Figures 6A, 6B:
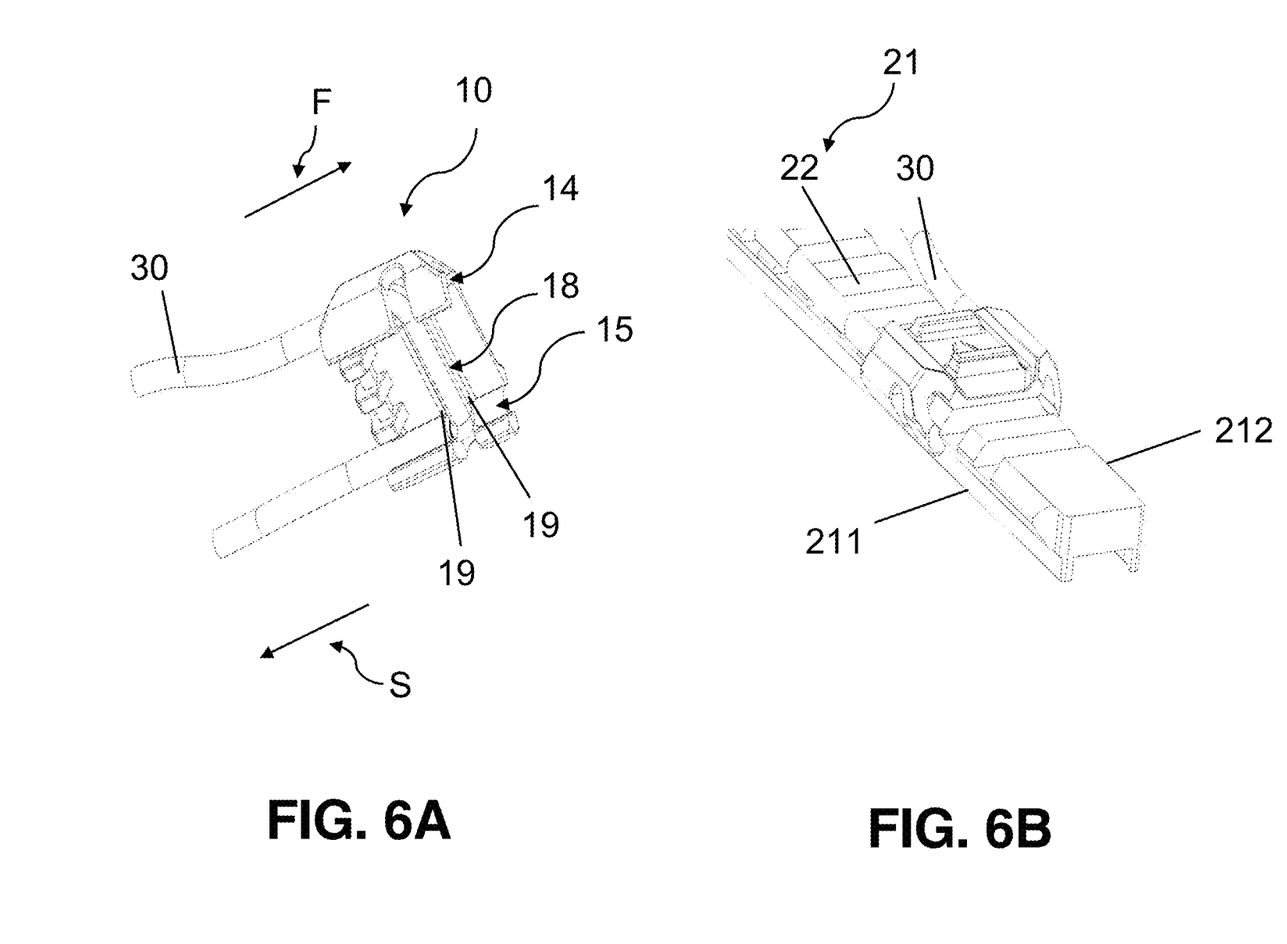
FIG. 6A is a bottom view of the cable management assembly being secured on the rail of the firearm according to another embodiment of the present invention.
FIG. 6B is a perspective view of the cable management assembly being secured on the rail of the firearm according to the another embodiment of the present invention.

FIGS. 6A-6B generally depict the cable management assembly 10 with the cable 30 being secured on the rail 21 of the firearm.

Referring to FIGS. 6A-6B, the cable 30 may be embedded inside a partial first groove 14 (e.g., not a whole body of the first groove 14), and then is bent to be embedded inside the third groove 18, and then may be bent to be embedded inside a partial second groove 15 (e.g., not a whole body of the second groove 15).

According to the embodiment of FIGS. 6A-6B, the cable 30 may be secured between the rail 21 and the first, second, and third grooves 14, 15, 18. Here, the cable 30 may be embedded inside the partial first groove 14 towards the first direction F, and then is bent at approximate (or equal to) 90 degrees for being embedded into the third groove 18, and then may be bent at approximate (or equal to) 90 degrees for being embedded into the second groove 15 towards the second direction S. It is noted that the cable 30 may not be passed through the main body 11 of the cable management assembly 10.

In an embodiment, the diameters of the first groove 14, the second groove 15, and the third groove 18 may be bigger than the diameter of the cable 30.

In an embodiment, the cable 30 may be secured along the side edge 211 of the rail 21 and the opposite side edge 212 of the rail 21.

In an embodiment, the cable 30 may be embedded inside the third groove 18 and one of the transverse slots 22 (including the transverse slot 22A and the another transverse slot 22B, as shown in FIG. 4) formed on the rail 21, and in such a manner, the cable 30 may be locked into the third groove 18 by the pair of the retaining lips 19, and the cable 30 may not move towards the first direction F and/or the second direction S.

Figure 7A:
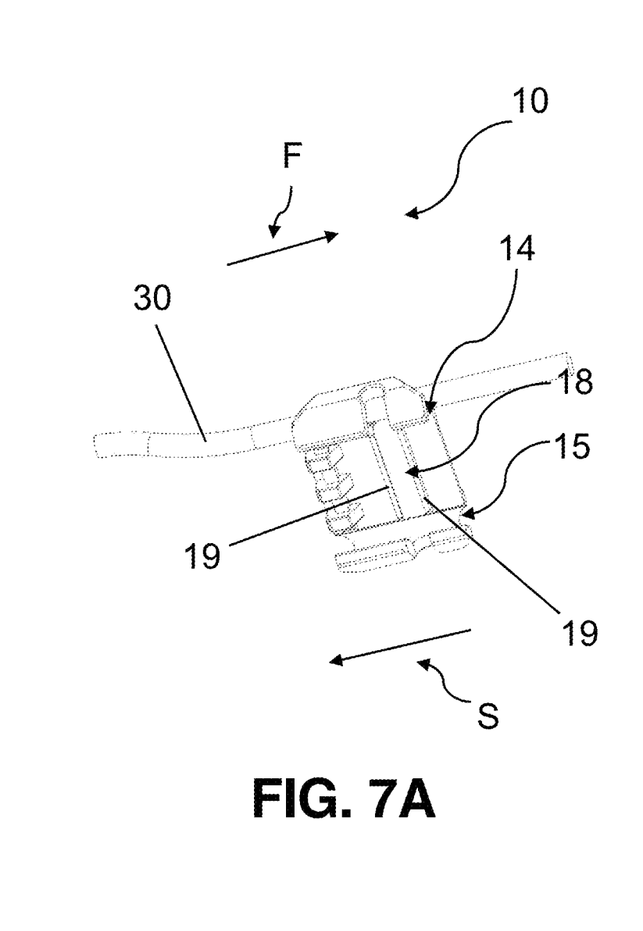
FIG. 7A is a bottom view of the cable management assembly being secured on the rail of the firearm according to still another embodiment of the present invention.
Figure 7B:
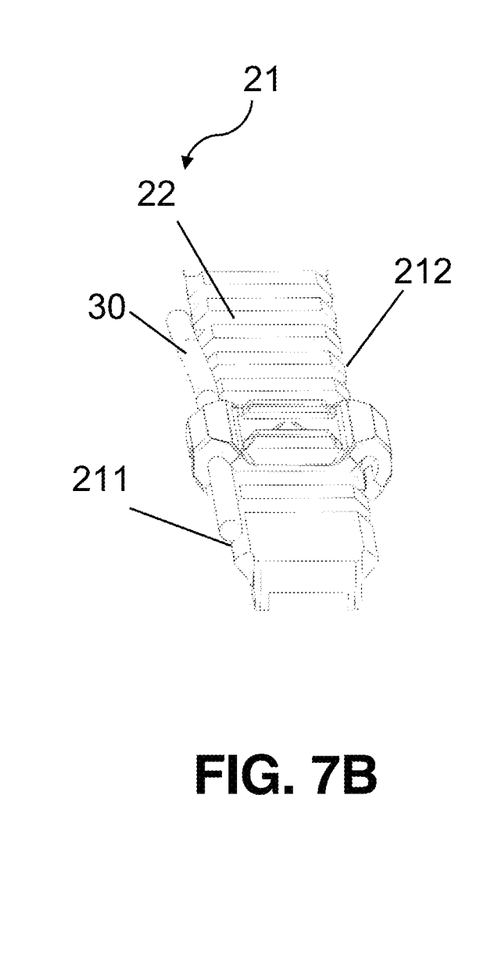
FIG. 7B is a perspective view of the cable management assembly being secured on the rail of the firearm according to the still another embodiment of the present invention.

FIGS. 7A-7B generally depict the cable management assembly 10 with the cable 30 being secured on the rail 21 of the firearm.

Referring to FIGS. 7A to 7B, the cable 30 may be embedded into the first groove 14 and passed through the first groove 15. It is noted that the cable 30 may be embedded into the first groove 14 without being embedded into the second groove 15 and the third groove 18. Here, the cable 30 may be secured towards the first direction F or the second direction S.

As shown in FIGS. 7A-7B, the cable 30 may be secured between the first groove 14 and the rail 21 of the firearm. In this manner, the cable 30 may be guided to be secured along the side edge 211 of the rail 21 of the firearm, and in other word, the cable 30 may be fixed towards one direction (the first direction F or the second direction S).

It should be noted that in some embodiments, the cable 30 may be embedded into the second groove 15 and be passed through the second groove 15. It is noted that the cable 30 may be embedded into the second groove 15 without being embedded into the first groove 14 and the third groove 18. Here, the cable 30 may be secured towards the first direction F or the second direction S.

In an embodiment, the diameter of the second groove 15 or the diameter of the first groove 14 may be bigger than the diameter of the cable 30.

In an embodiment, the cable 30 may be secured along the side edge 211 of the rail 21 or along the opposite side edge 212 of the rail 21.

Figure 8A:
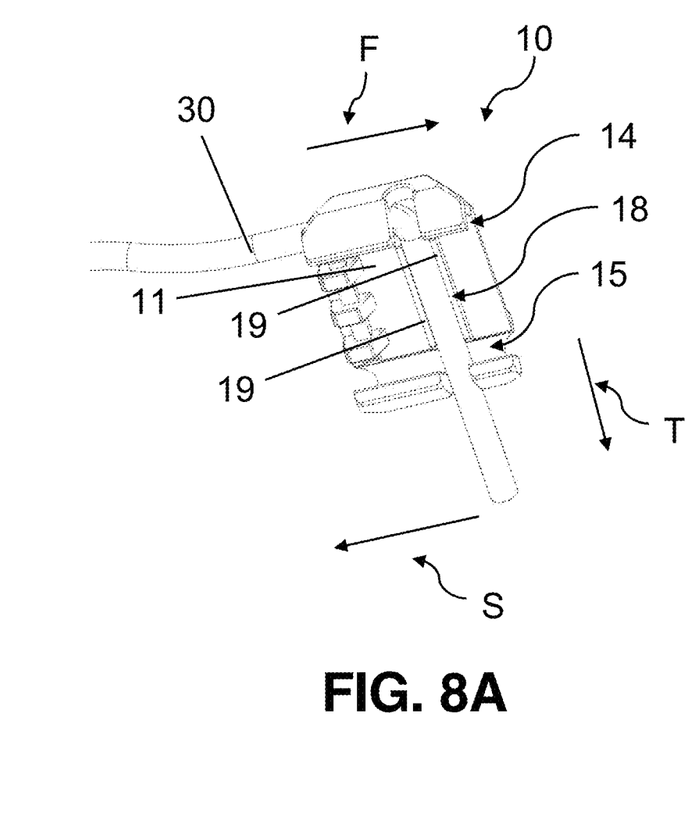
FIG. 8A is a bottom view of the cable management assembly being secured on the rail of the firearm according to still another embodiment of the present invention.
Figure 8B:
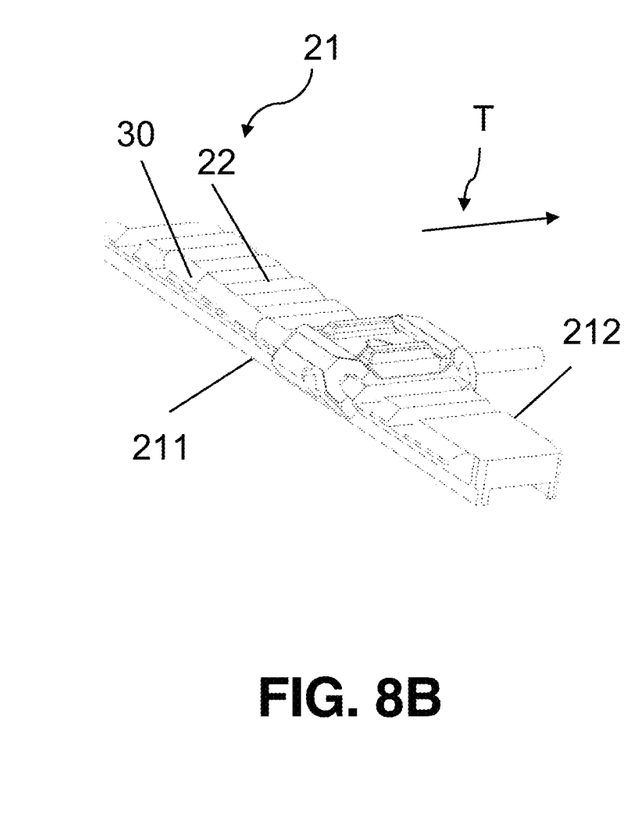
FIG. 8B is a perspective view of the cable management assembly being secured on the rail of the firearm according to the still another embodiment of the present invention.

FIGS. 8A-8B generally depict the cable management assembly 10 with the cable 30 being secured on the rail 21 of the firearm.

Referring to FIGS. 8A to 8B, the cable 30 may be embedded into the partial first groove 14 (e.g., not the whole of the first groove 14), and then may be bent at approximate 90 degrees (or equal to 90 degrees) for being embedded into the third groove 18 (e.g., a whole of the third groove 18). It is noted that the cable 30 may be entered into the first groove 14 and exited the main body 11 through the third groove 18, wherein the cable 30 may be embedded inside the first groove 14 and then may be bent to be embedded inside the third groove 18 without being embedded inside the second groove 15. Here, the cable 30 may be embedded into the first groove 14 towards the first direction F and may be bent towards the third direction T with the cable 30 being engaged with the third groove 18, and then the cable 30 may be passed through the right side opening 131 formed on the second sidewall 13 (as shown in FIG. 3). Here, the first direction F may be vertical to the third direction T.

As shown in FIG. 8B, the cable 30 may be secured between the first and third grooves 14, 18 and the rail 21 of the firearm. For example, the cable 30 may be secured along the side edge 211 of the rail 21 and then may be bent for securing on the rail 21 towards the third direction T which may be vertical to the rail 21. In other words, the cable 30 may not be passed through the whole of the first groove 14.

In an embodiment, the diameters of the first groove 14 and the third groove 18 may be bigger than the diameter of the cable 30.

In an embodiment, the cable 30 may be embedded inside the third groove 18 and one of the transverse slots 22 (including the transverse slot 22A and the another transverse slot 22B, as shown in FIG. 4) formed on the rail 21, and in such a manner, the cable 30 may be locked into the third groove 18 by the pair of the retaining lips 19, and the cable 30 may not move towards the first direction F and/or the second direction S.

Figure 9A:
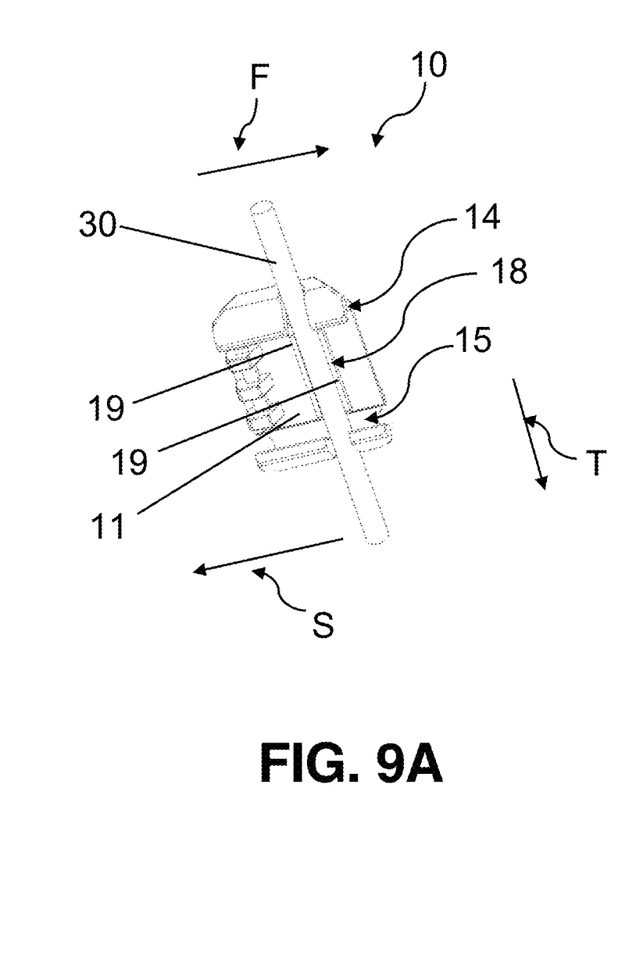
FIG. 9A is a bottom view of the cable management assembly being secured on the rail of the firearm according to still another embodiment of the present invention.
Figure 9B:
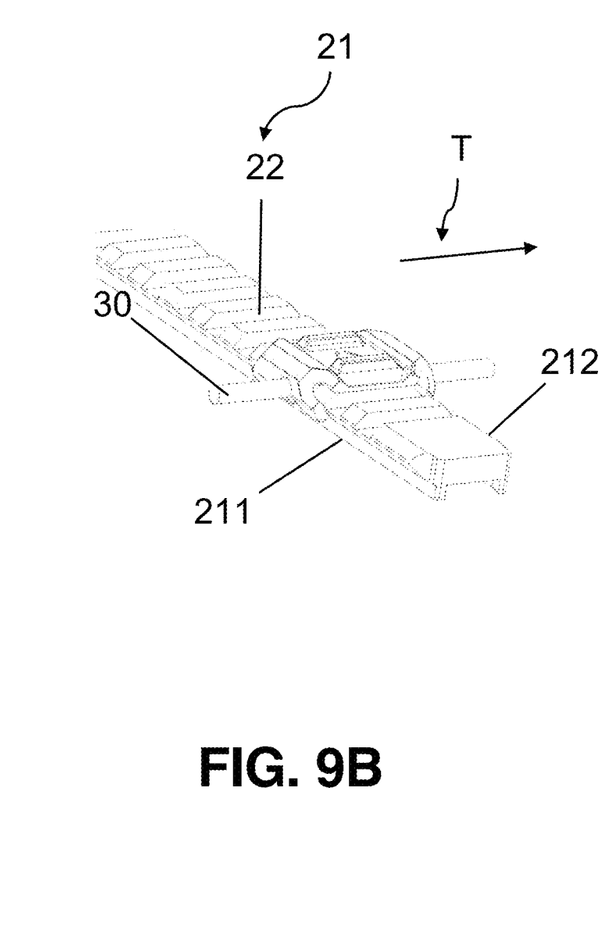
FIG. 9B is a perspective view of the cable management assembly being secured on the rail of the firearm according to the still another embodiment of the present invention.

FIGS. 9A-9B generally depict the cable management assembly 10 with the cable 30 being secured on the rail 21 of the firearm.

Referring to FIGS. 9A to 9B, the cable 30 may be embedded inside the third groove 18, and in such a manner, the cable 30 may be locked into the third groove 18 by the pair of the retaining lip 19, and the cable 30 may not move towards the first direction F and/or the second direction S.

As shown in FIGS. 9A-9B, the cable 30 may be secured between the third groove 18 and the rail 21 of the firearm, wherein the cable 30 may be secured on the rail 21 towards the third direction T and passed through the whole body of the main body 11. Here, the cable 30 may be secured to be vertical to the rail 21 of the firearm.

In an embodiment, the diameter of the third groove 18 may be bigger than the diameter of the cable 30.

In an embodiment, the cable 30 may be secured on the rail 21 and be extended across the rail 21.

In an embodiment, the cable 30 may be embedded inside the third groove 18 and one of the transverse slots 22 (including the transverse slot 22A and the another transverse slot 22B, as shown in FIG. 4) formed on the rail 21, and in such a manner, the cable 30 may be locked into the third groove 18 by the pair of the retaining lips 19, and the cable 30 may not move towards the first direction F and/or the second direction S.

Figure 10A:
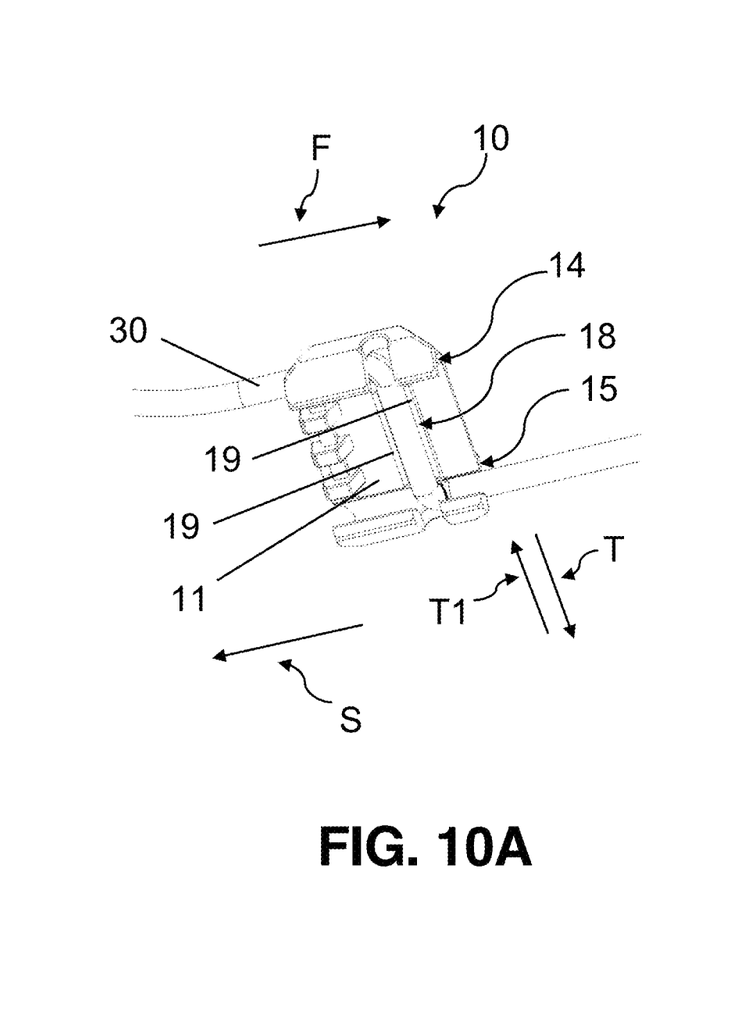
FIG. 10A is a bottom view of the cable management assembly being secured on the rail of the firearm according to still another embodiment of the present invention.
Figure 10B:
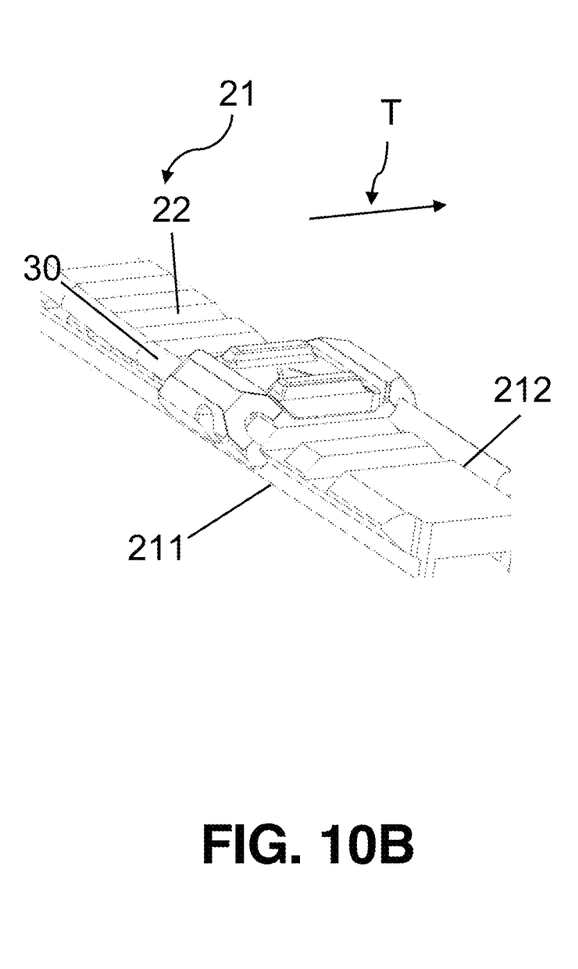
FIG. 10B is a perspective view of the cable management assembly being secured on the rail of the firearm according to the still another embodiment of the present invention.

FIGS. 10A-10B generally depict the cable management assembly 10 with the cable 30 being secured on the rail 21 of the firearm.

Referring to FIG. 10A-10B, the cable 30 may be embedded inside the partial first groove 14 towards the first direction F, and then may be bent at approximate 90 degrees (or equal to 90 degrees) for embedding inside the third groove 18 towards the third direction T, and then may be bent at approximate 90 degrees (or equal to 90 degrees) for embedding inside the partial second groove towards the first direction F.

In an embodiment, the cable 30 may be embedded inside the partial second groove 15 towards the second direction S, and then may be bent at approximate 90 degrees (or equal to 90 degrees) for embedding inside the third groove 18 towards a fourth direction Ti, and then may be bent at approximate 90 degrees (or equal to 90 degrees) for embedding inside the partial first groove 14 towards the second direction S.

As shown in FIGS. 10A-10B, the cable 30 may be secured between the first, second, and third grooves 14, 15, 18 and the rail 21 of the firearm. For example, the cable 30 may be secured along the side edge 211 of the rail 21, and then may be bent to be embedded inside the third groove 18 and the transverse slot 22 (the another transverse slot 22B as shown in FIG. 4) formed on the rail 21, and then may be bent to be secured along the opposite side edge 212 of the rail 21.

According to the embodiment of FIGS. 10A to 10B, while the cable 30 is embedded inside the third groove 18 and the transverse slot 22 (the another transverse slot 22B as shown in FIG. 4) formed on the rail 21, and in such a manner, the cable 30 may be locked into the third groove 18 by the pair of the retaining lip 19 and the cable 30 may not move towards the first direction F and/or the second direction S.

In an embodiment, the diameters of the first groove 14, the second groove 15, and the third groove 18 may be bigger than the diameter of the cable 30.

Figure 11A:
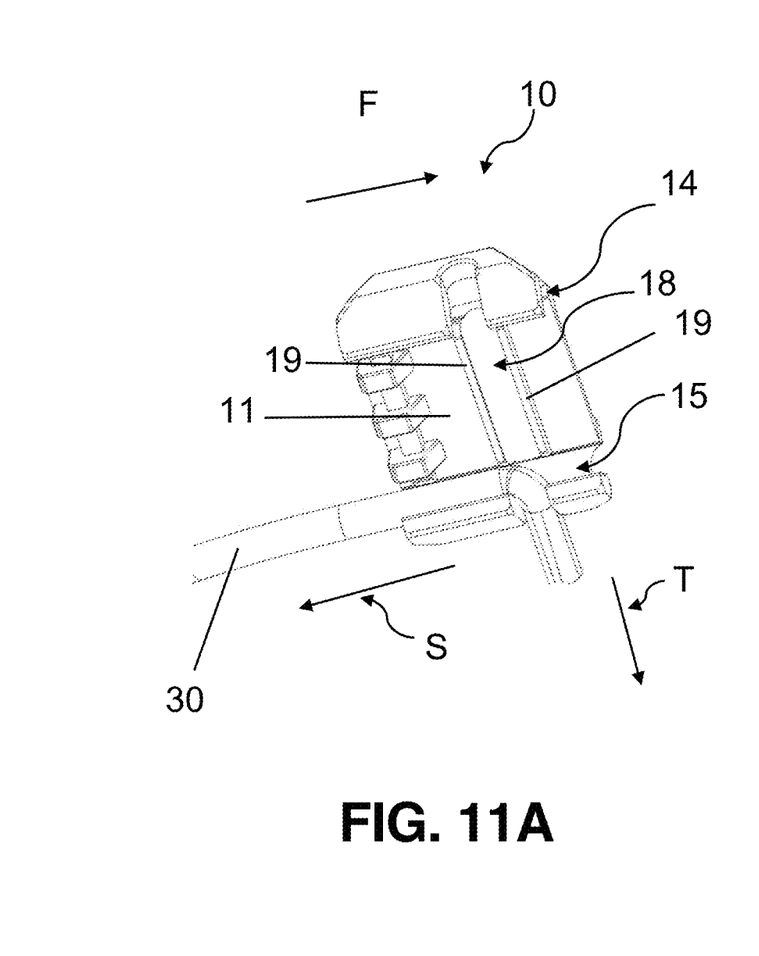
FIG. 11A is a bottom view of the cable management assembly being secured on the rail of the firearm according to still another embodiment of the present invention.
Figure 11B:
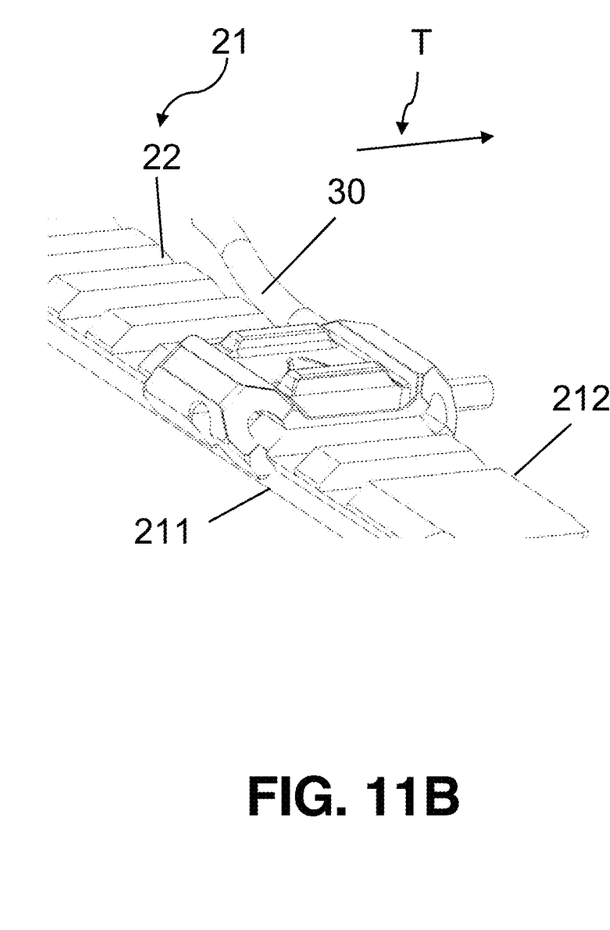
FIG. 11B is a perspective view of the cable management assembly being secured on the rail of the firearm according to the still another embodiment of the present invention.

FIGS. 11A-11B generally depict the cable management assembly 10 with the cable 30 being secured on the rail 21 of the firearm.

Referring to FIG. 11A-11B, the cable 30 may be embedded inside the partial second groove 15 without being embedded inside the first groove 14, and in such a manner, the cable 30 may be embedded inside the partial second groove 15 and then be bent to pass through the right side opening 131 formed on the second sidewall 13 (see details in FIG. 3).

In an embodiment, the cable 30 may be embedded inside the partial first groove 14 without being embedded inside the second groove 15, and in such a manner, the cable 30 may be embedded inside the partial first groove 14 and then be bent to pass through the left side opening 121 formed on the first sidewall 12 (see details in FIG. 3).

With specific reference to FIGS. 11A-11B, it should be noted that in some embodiments, the cable 30 may be secured along the side edge 211 or the opposite side edge 212 of the rail 21 and may be bent at approximate 90 degrees (or equal to 90 degrees) to pass through the left side opening 121 or the right side opening 131 of the third groove 18.

Many alterations and modifications may be made by those having ordinary skill in the art without departing from the spirit and scope of the disclosed embodiments. Therefore, it must be understood that the illustrated embodiments have been set forth only for the purposes of example and that it should not be taken as limiting the embodiments as defined by the following claims. For example, notwithstanding the fact that the elements of a claim are set forth below in a certain combination, it must be expressly understood that the embodiment includes other combinations of fewer, more, or different elements, which are disclosed herein even when not initially claimed in such combinations.

Thus, specific embodiments and applications of the cable management assembly for firearm have been disclosed. It should be apparent, however, to those skilled in the art that many more modifications besides those already described are possible without departing from the disclosed concepts herein. The disclosed embodiments, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Insubstantial changes from the claimed subject matter as viewed by a person with ordinary skill in the art, now known or later devised, are expressly contemplated as being equivalent within the scope of the claims. Therefore, obvious substitutions now or later known to one with ordinary skill in the art are defined to be within the scope of the defined elements. The claims are thus to be understood to include what is specifically illustrated and described above, what is conceptually equivalent, what can be obviously substituted and also what essentially incorporates the essential idea of the embodiments. In addition, where the specification and claims refer to at least one of something selected from the group consisting of A, B, C . . . and N, the text should be interpreted as requiring at least one element from the group which includes N, not A plus N, or B plus N, etc.

The words used in this specification to describe the various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims therefore include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

What is claimed is:

1. A cable management assembly attaching to a rail of a firearm, comprising:
   a main body having a bottom surface;
   a plurality of grooves formed on the bottom surface; and
   a cable selectively embedded within the plurality of the grooves;
   wherein the rail has a plurality of transverse slots and at least one of the plurality of transverse slots is covered by the cable management assembly;
   wherein one of the plurality of grooves is communicated and intersects with another one of the plurality of grooves, so the cable is bent and turned at an intersection between two intersected grooves, wherein the main body further comprises a pair of retaining lips formed on the bottom surface and configured to secure the cable embedded inside one of the plurality of grooves, and a distance between the pair of the retaining lip is shorter than a width of each of the plurality of transverse slots, so the pair of the retaining lips is configured to be inserted in any one of the transverse slots of the rail.

2. The cable management assembly of claim 1, wherein the main body further comprises opposing first and second side edges, a first sidewall extending from the first side edge and a second sidewall extending from the second side edge, wherein the first and second sidewalls are configured to slidably engage with the rail.

3. The cable management assembly of claim 1, wherein a rail securing protrusion comprises a plurality of locking members, each of the locking members having an angled front face defining a slope in order to accommodate a tolerance of the rail.

4. The cable management assembly of claim 1, further comprising a rail securing protrusion on the bottom surface of the main body, wherein the rail securing protrusion is inserted into a transverse slot formed on the rail of the firearm for securing the main body on the rail, and the retaining lips are inserted into another transverse slot formed on the rail of the firearm for securing the cable being fasten between the another transverse slot and the one of the plurality of grooves.

5. The cable management assembly of claim 4, wherein the rail securing protrusion comprises a plurality of locking members, each of the locking members having an angled front face defining a slope in order to accommodate a tolerance of the rail.

6. A cable management assembly attaching to a rail of a firearm, comprising:
   a main body having a bottom surface;
   a plurality of grooves formed on the bottom surface;
   a cable selectively embedded within the plurality of grooves; and
   a rail securing protrusion formed on the bottom surface of the main body;
   wherein the rail has a plurality of transverse slots and at least one of the plurality of transverse slots is covered by the cable management assembly;
   wherein the rail securing protrusion comprises a plurality of locking members, each of the locking members having an angled front face defining a slope in order to accommodate a tolerance of the rail;
   wherein one of the plurality of grooves is communicated and intersects with another one of the plurality of grooves, so the cable is bent and turned at an intersection between two intersected grooves,
   wherein the main body further comprises a pair of retaining lips formed on the bottom surface and configured to secure the cable embedded inside one of the plurality of grooves, and a distance between the pair of the retaining lip is shorter than a width of each of the plurality of transverse slots, so the pair of the retaining lips is configured to be inserted in any one of the transverse slots of the rail.

7. The cable management assembly of claim 6, wherein the main body further comprises a pair of retaining lips formed on the bottom surface and configured to secure the cable embedded inside one of the plurality of grooves.

8. The cable management assembly of claim 7, wherein the pair of retaining lips are arranged on a front edge and a rear edge of the one of the plurality of grooves.

9. The cable management assembly of claim 7, wherein the rail securing protrusion is inserted into a transverse slot formed on the rail of the firearm for securing the main body on the rail, and the retaining lips are inserted into another transverse slot formed on the rail of the firearm for securing the cable being fasten between said another transverse slot and the one of the plurality of grooves.

10. A cable management assembly attaching to a rail of a firearm, comprising:
    a main body having a bottom surface;
    a plurality of grooves formed on the bottom surface;
    a cable selectively embedded within the plurality of grooves;
    a rail securing protrusion formed on the bottom surface of the main body; and
    a pair of retaining lips formed on the bottom surface and configured to secure the cable embedded inside one of the plurality of grooves;
    wherein one of the plurality of grooves is communicated and intersects with another one of the plurality of grooves, so the cable is bent and turned at an intersection between two intersected grooves,
    wherein the rail has a plurality of transverse slots and at least one of the plurality of transverse slots is covered by the cable management assembly, and a distance between the pair of the retaining lip is shorter than a width of each of the plurality of transverse slots, so the pair of the retaining lips is configured to be inserted in any one of the transverse slots of the rail.

11. The cable management assembly of claim 10, wherein the rail securing protrusion is inserted into a transverse slot formed on the rail of the firearm for securing the main body on the rail, and the retaining lips are inserted into another transverse slot formed on the rail of the firearm for securing the cable being fasten between said another transverse slot and the one of the plurality of grooves.

12. The cable management assembly of claim 10, wherein the rail securing protrusion comprises a plurality of locking members, wherein each of the locking members comprises an angled front face defining a slope in order to accommodate a tolerance of the rail.

13. The cable management assembly of claim 10, wherein the pair of retaining lips are arranged on a front edge and a rear edge of the one of the plurality of grooves.

14. The cable management assembly of claim 10, wherein the main body further comprises opposing first and second side edges, a first sidewall extending from the first side edge, and a second sidewall extending from the second side edge, wherein the first and second sidewalls are configured to slidably engage with the rail.

* * * * *